United States Patent
Kim

(10) Patent No.: US 10,026,354 B2
(45) Date of Patent: Jul. 17, 2018

(54) GATE IN PANEL (GIP) DRIVING CIRCUIT AND DISPLAY DEVICE USING THE SAME

(71) Applicant: LG Display Co., Ltd., Seoul (KR)

(72) Inventor: Byungil Kim, Gimpo-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/366,923

(22) Filed: Dec. 1, 2016

(65) Prior Publication Data

US 2017/0178559 A1     Jun. 22, 2017

(30) Foreign Application Priority Data

Dec. 17, 2015 (KR) .................. 10-2015-0180775

(51) Int. Cl.
*G06F 1/00* (2006.01)
*G09G 3/20* (2006.01)

(52) U.S. Cl.
CPC ....... *G09G 3/2092* (2013.01); *G09G 2300/08* (2013.01); *G09G 2310/0243* (2013.01); *G09G 2310/08* (2013.01)

(58) Field of Classification Search
CPC ...... G09G 3/3674; G09G 1/00; G09G 3/3266; G06F 1/00; G06F 3/00; H03K 3/00; H04L 1/00; G11C 19/28
See application file for complete search history.

(56) References Cited

U.S. PATENT DOCUMENTS

2014/0085285 A1* 3/2014 Kim .................. G09G 3/3266
                                                          345/211
2014/0313174 A1* 10/2014 Murakami ............ G11C 19/28
                                                          345/204

FOREIGN PATENT DOCUMENTS

EP            2445108 A1    4/2012

OTHER PUBLICATIONS

Extended European Search Report for European Patent Application No. EP 16202883.1, dated Mar. 22, 2017, 9 pages.

\* cited by examiner

*Primary Examiner* — Michael Faragalla
(74) *Attorney, Agent, or Firm* — Fenwick & West LLP

(57) ABSTRACT

Provided are a GIP driving circuit and a display device using the same. The GIP driving circuit includes: a plurality of stages which sequentially receives a phase-delayed clock and sequentially generates an output. An nth stage (n is a positive integer) includes: a first switch T1 receiving a carry signal from an n−1th stage and controlling a QB node to a low voltage and a Q node to a high voltage when the carry signal has a high voltage; a second switch T2 receiving a carry signal from an n+1th stage and controlling the QB and Q nodes high and low voltages, respectively, when the carry signal has a high voltage; a plurality of inverters connected between nodes Q and QB and constituting a latch; and a buffer outputting a clock as an output voltage when a voltage of the Q node is a high voltage and output.

10 Claims, 5 Drawing Sheets

GATE IN PANEL (GIP) DRIVING CIRCUIT AND DISPLAY DEVICE USING THE SAME

CROSS-REFERENCE TO RELATED APPLICATIONS

This application claims the priority under 35 U.S.C § 119(a) to Republic of Korea Patent Application No. 10-2015-0180775 filed on Dec. 17, 2015, in the Korean Intellectual Property Office, the disclosure of which is incorporated herein by reference.

BACKGROUND

Field of Art

The present disclosure relates to a GIP driving circuit including a CMOS (complementary metal-oxide-semiconductor) transistor and a display device using the same.

Description of the Related Art

With the development of the information society, various demands for display devices for displaying image have been increasing. Accordingly, in recent years, various flat panel display (FPD) devices, with lesser weight and volume than a cathode ray tube, have been developed and commercialized. For example, various FPD devices such as a liquid crystal display (LCD), a plasma display panel (PDP), and an organic light emitting diode (OLED) display device are being used.

A display device displays an image using a gate driving circuit supplying scan signals to gate lines on a display panel and a data driving circuit supplying data voltages to data lines. The gate driving circuit may be formed by a Tape-Automated Bonding (TAB) method in which a printed circuit board mounted with a plurality of gate drive integrated circuits thereon is bonded to the display panel. Otherwise, the gate driving circuit may be formed by a Gate In Panel (GIP) method in which gate drive integrated circuits are directly formed on the display panel. As compared with the TAB method, the GIP method is capable of slimming a display device and thus improving the beauty and also reducing the manufacturing costs thereof. Further, according to the GIP method, a display panel maker can design a plurality of scan signals for compensating a threshold voltage of a driving thin film transistor (TFT) of a pixel. Therefore, in recent years, the gate driving circuit has been formed by the GIP method rather than the TAB method.

According to the GIP method, a shift register in a gate driving circuit includes stages which are connected in a cascade manner and sequentially generate scan signals. The shift register needs components or lines in order to normally drive a GIP driving circuit.

As a result, it is not easy to efficiently design a bezel area of a display device. In this regard, recently, various research and development are being conducted to reduce a size of a bezel which is an inactive area of a display device.

SUMMARY

A driving circuit of a display device includes a pixel array where an image is displayed and a data driving circuit supplies data signals to data lines on the pixel array. The driving circuit further includes a gate driving circuit (or a scan driving circuit) sequentially supplying gate pulses (or scan pulses) synchronized with the data signals to gate lines (or scan lines) on the pixel array. Also, the driving circuit includes a timing controller controlling the data driving circuit and the gate driving circuit.

Each of the pixels may include a thin film transistor (TFT) supplying a voltage of a data line to a pixel electrode in response to a gate pulse supplied through a gate line. The gate pulse swings between a gate high voltage (VGH) and a gate low voltage (VGL). The VGH is set to be higher than a threshold voltage of the TFT formed on the display panel, and the VGL is set to be lower than the threshold voltage of the TFT. The TFTs on the respective pixels are turned on in response to the VGH.

A technology of installing the gate driving circuit together with the pixel array in the display panel has been applied. The gate driving circuit installed in the display panel is known as "Gate In Panel (GIP) circuit". The GIP circuit includes a shift register. The shift register includes a plurality of stages connected in a cascade manner.

FIG. 1 is a circuit diagram of an nth stage (n is a positive integer) of a shift register in a GIP driving circuit of a conventional display device. In FIG. 1, M1, M3, and M5 are implemented with an n-type MOSFET (hereinafter, referred to as "NMOS"), and M2 and M4 are implemented with a p-type MOSFET (hereinafter, referred to as "PMOS").

Referring to FIG. 1, an nth stage STn includes a shift register logic unit 11, a reset voltage terminal, and a gate pulse output unit 13.

A shift register 10 sequentially outputs gate pulses Gout. In order to do so, sequentially delayed gate shift clocks CLK_A and CLK_B are input to the nth stage Stn. Further, a carry signal Gout_Pre received from a previous stage, a carry signal Gout_Post received from a subsequent stage, a reset pulse RST, a gate high voltage VGH, and a gate low voltage VGL are input to the nth stage Stn.

The carry signal Gout_Pre input to an nth stage except a first stage is an output Gout of an n−2th stage. The carry signal Gout_Pre is not input to the first stage ST1, but the start pulse VST is input to the first stage ST1. The carry signal Gout_Post input to the nth stage is an output Gout of an n+2th stage.

In the shift register logic unit 11, a first inverter and a second inverter are connected in a feedback manner to constitute a latch. Further, a third inverter is connected to an M2 TFT, so that a low voltage VGL is applied to a QB node and a high voltage VGH is applied to a Q node connected to the first inverter. Thus, the shift register logic unit 11 controls the shift register 10 not to output a previous gate pulse of the nth stage STn.

In the shift register logic unit 11, the third inverter is connected to an M1 TFT, so that a high voltage VGH is applied to the QB node and a low voltage is applied to the Q node connected to the first inverter. Thus, the shift register logic unit 11 controls the shift register 10 not to output a gate pulse of the nth stage STn.

The reset voltage terminal 12 is connected to the first inverter. A reset voltage is changed from a high voltage VGH to a low voltage VGL through a reset voltage transmission line and then input to the first inverter. As a result, the Q node is applied with the low voltage VGL and the QB node is applied with the high voltage VGH.

Therefore, if the GIP driving circuit is powered on, the Q node and the QB node are reset to a state for starting an operation of the GIP driving circuit.

Then, the gate pulse output unit 13 includes a transmission gate TG and an M5 TFT. The gate pulse output unit 13 outputs a gate shift clock CLK_B corresponding to a gate high voltage VGH through the transmission gate in response to a potential of the Q node of the shift register logic unit 11. Further, the gate pulse output unit 13 discharges an output voltage to a low-potential voltage VSS in response to a potential of the QB node of the shift register logic unit 11. For example, the gate pulse output unit 13 discharges an output voltage to the low-potential voltage VSS through the M5 TFT when the potential of the QB node of the shift register logic unit 11 is a high-potential voltage.

Referring to FIG. 1, the conventional GIP driving circuit needs an operation for initiating stages ST1 to STn, an operation for limiting an output of a previous output voltage Gout, and an operation for controlling an output voltage after a gate pulse is output in order to maintain a stable operation state. Thus, the conventional GIP driving circuit needs additional circuits for these operations.

Further, in the shift register, the stages ST1 to STn are connected in a cascade manner. Each of the stages ST1 to Stn receives a first carry signal Gout_Pre for pre-charging the Q node in order to generate an output. Further, each stage generates an output signal and then receives a second carry signal Gout_Post for discharging the Q node. In order to do so, the shift register further includes dummy stages which do not generate outputs but supply carry signals to the other stages. For example, an nth stage (n is a positive integer equal to or greater than 2) outputting the last gate pulse is connected to an n+1th stage (or end generator). The n+1th stage does not output a gate pulse but supplies the second carry signal Gout_Post to the nth stage.

Various research and development are being conducted to optimize a GIP circuit in order to reduce a bezel of a display device. However, the components or lines required for a stable operation of a GIP driving circuit cannot be removed. Thus, a size of the GIP driving circuit cannot be reduced. Therefore, it is difficult to design a narrow bezel of a display device due to a size of a GIP circuit. Accordingly, the inventors of the present disclosure invented a new structure and method regarding a GIP driving circuit for a narrow bezel design.

The present disclosure is provided to solve the above-described problems. According to the present disclosure, a latch is formed by connecting two inverters in a feedback manner and a drain of an NMOS TFT is connected to a Q node and a QB node. Thus, a GIP gate driving circuit capable of controlling the Q and QB nodes with a Gout_Pre and a Gout_Post can be provided.

In addition to the above-mentioned objects of the present disclosure, other features and advantages of the present disclosure will be described below, or will be clearly understood by a person having ordinary skill in the art from descriptions below.

According to an aspect of the present disclosure, there is provided a gate driving circuit. The gate driving circuit includes: a plurality of stages which sequentially receives a phase-delayed clock and sequentially generates an output. An nth stage (n is a positive integer) includes: a first switch T1 receiving a carry signal from an n−1th stage (n is a positive integer) and controlling a QB node to a low voltage and a Q node to a high voltage when the carry signal has a high voltage; a second switch T2 receiving a carry signal from an n+1th stage (n is a positive integer) and controlling the QB node to a high voltage and the Q node to a low voltage when the carry signal has a high voltage; a plurality of inverters connected between the Q node and the QB node and constituting a latch; and a buffer outputting a clock as an output voltage when a voltage of the Q node is a high voltage and output a low voltage as an output voltage when a voltage of the QB node is a high voltage.

According to the present disclosure, a latch is formed by connecting two inverters in a feedback manner and a drain of an NMOS TFT is connected to a Q node and a QB node so as to control the Q and QB nodes with a Gout_Pre and a Gout_Post. Thus, it is possible to simplify a gate driving circuit and thus possible to implement a narrow bezel of a display device.

BRIEF DESCRIPTION OF THE DRAWINGS

The above and other aspects, features and other advantages of the present disclosure will be more clearly understood from the following detailed description taken in conjunction with the accompanying drawings.

DETAILED DESCRIPTION OF THE PREFERRED EMBODIMENT

Figure 1:
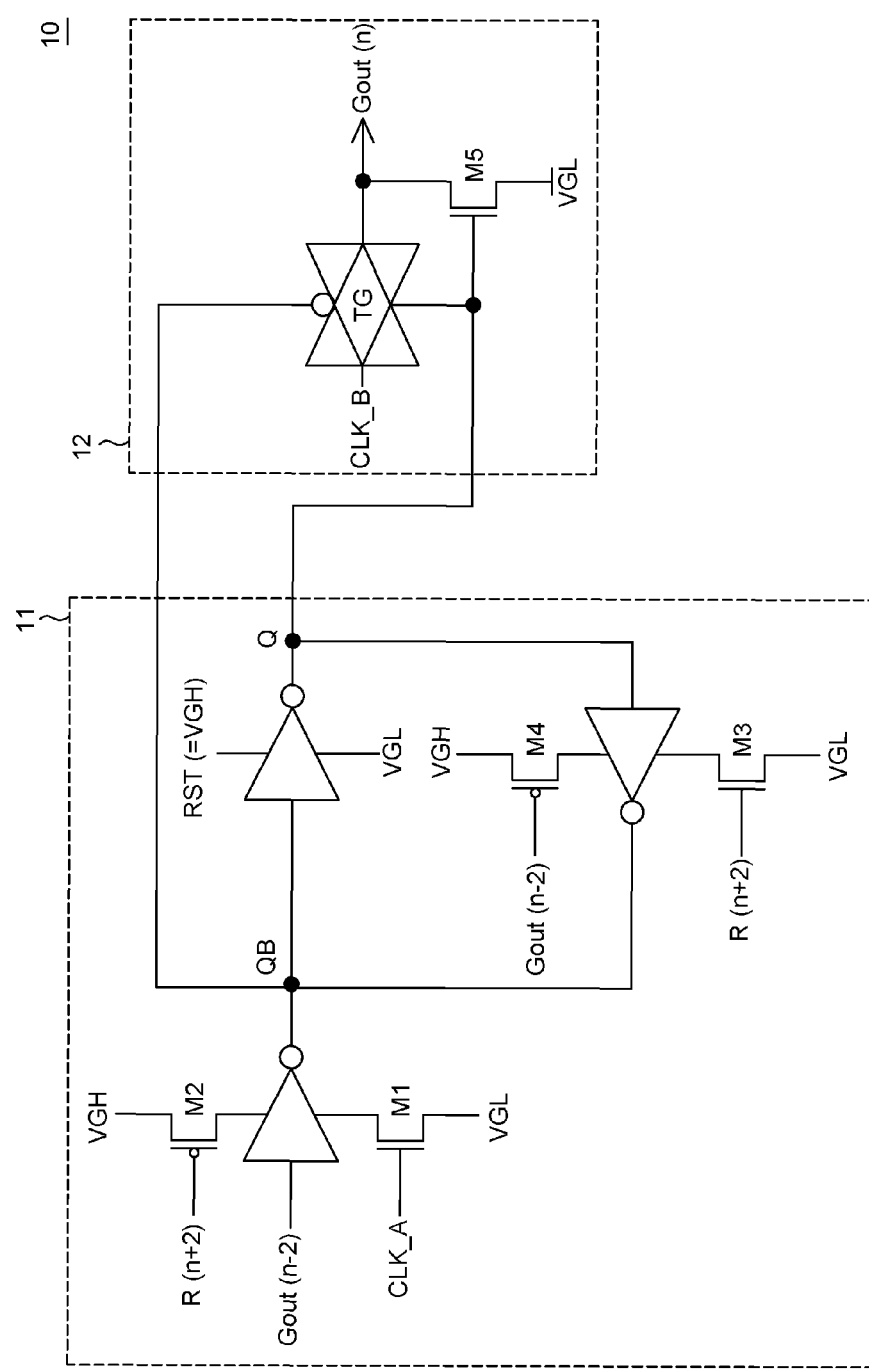
FIG. 1 is a circuit diagram of an nth stage (n is a positive integer) of a shift register in a GIP driving circuit of a conventional display device.

Advantages and features of the present disclosure, and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the disclosure, and the present disclosure will be defined by the appended claims.

The shapes, sizes, ratios, angles, numbers, and the like illustrated in the accompanying drawings for describing the exemplary embodiments of the present disclosure are merely examples, and the present disclosure is not limited thereto. Further, in the following description, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is referred to as being "on" another element or layer, it may be directly on the other element or layer, or intervening elements or layers may be present.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Throughout the whole specification, the same reference numerals denote the same elements.

Since size and thickness of each component illustrated in the drawings are represented for convenience in explanation, the present disclosure is not necessarily limited to the illustrated size and thickness of each component.

The features of various embodiments of the present disclosure can be partially or entirely bonded to or combined with each other and can be interlocked and operated in technically various ways as can be fully understood by a person having ordinary skill in the art, and the embodiments can be carried out independently of or in association with each other.

Hereinafter, various exemplary embodiments of the present disclosure will be described in detail with reference to FIG. 2 through FIG. 5.

Figure 2:
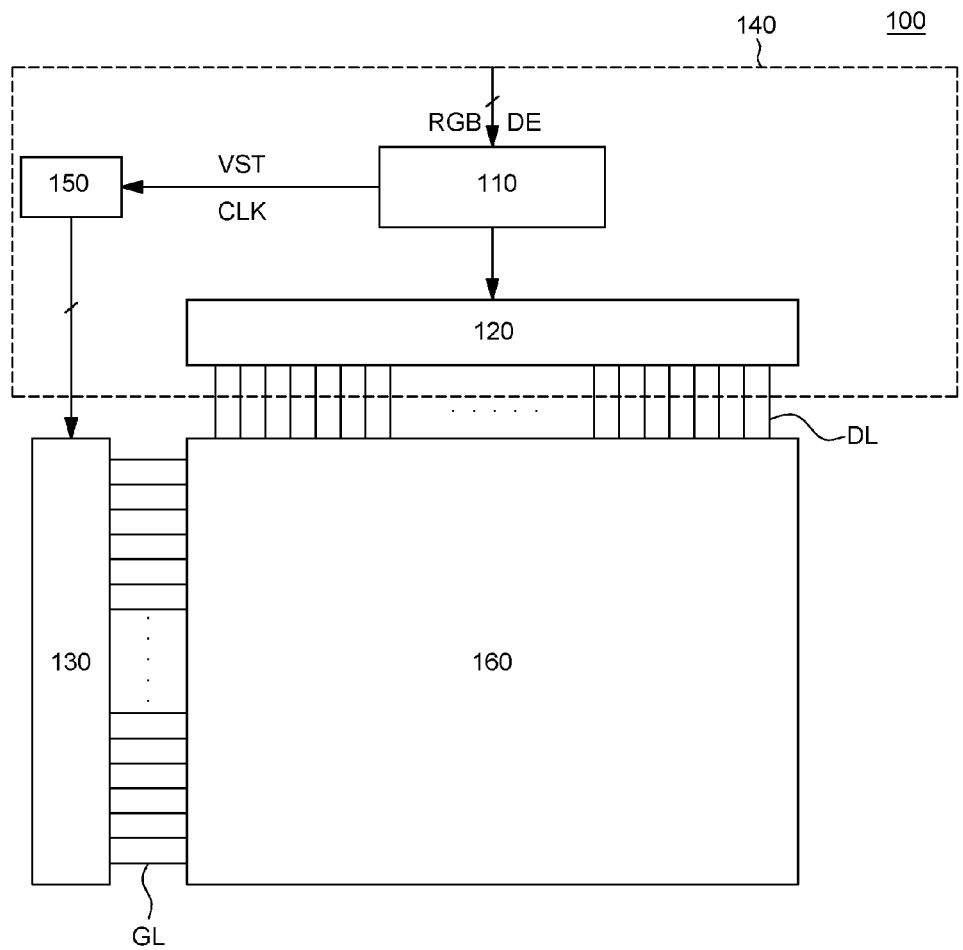
FIG. 2 is a block diagram illustrating a driving circuit of a display device according to an exemplary embodiment of the present disclosure.

FIG. 2 is a block diagram illustrating a driving circuit of a display device according to an exemplary embodiment of the present disclosure.

Referring to FIG. 2, a display device according to the present disclosure includes a display panel 160, a data driving circuit 120, a level shifter 150, a gate shift register 130, a PCB 140, and a timing controller 110.

The display panel 160 includes data lines DL and gate lines GL intersecting with each other and pixels disposed in a matrix shape. The display panel 160 may be a liquid crystal display (LCD), an organic light emitting diode (OLED), an electrophoretic display (EPD), or the like.

The data driving circuit 120 includes a plurality of source drive ICs. The source drive ICs 120 receive digital video data RGB from the timing controller 110. The source drive ICs 120 convert the digital video data RGB into a gamma correction voltage to generate a data voltage, in response to a source timing control signal from the timing controller. Then, the source drive ICs 120 supply the data voltage to the data lines of the display panel 160 in synchronization with a gate pulse. The source drive ICs 120 may be connected to the data lines DL of the display panel 160 through a Chip On Glass (COG) process or a Tape Automated Bonding (TAB) process.

A scan driving circuit includes the level shifter 150 and the gate shift register 130 connected between the timing controller 110 and the gate lines GL of the display panel 160.

The level shifter 150 level-shifts a transistor-transistor-logic (TTL) level voltage of a gate shift clock CLK input from the timing controller 110 to a gate high voltage VGH and a gate low voltage VGL. In the following exemplary embodiment of the present disclosure, driving using the gate shift clock CLK will be exemplified.

The gate shift register 130 includes stages which shift a gate start pulse VST according to the gate shift clock CLK and sequentially output a carry signal and a gate pulse Gout.

The scan driving circuit may be directly formed on a lower substrate of the display panel 160 by a Gate In Panel (GIP) method. According to the GIP method, the level shifter 150 may be mounted on the PCB 140 and the gate shift register 130 may be formed on the lower substrate of the display panel 160.

The timing controller 110 receives digital video data RGB from an external host computer through an interface such as a Low Voltage Differential Signaling (LVDS) interface, or a Transition Minimized Differential Signaling (TMDS) interface. The timing controller 110 transmits the digital video data RGB input from the host computer to the source drive ICs 120.

The timing controller 110 receives timing signals, such as a vertical synchronization signal Vsync, a horizontal synchronization signal Hsync, a data enable signal DE, and a main clock MCLK from the host computer through an LVDS or TMDS interface receiving circuit.

The timing controller 110 generates timing control signals to control an operation timing of the data driving circuit and the scan driving circuit based on the timing signals from the host computer. The timing control signals include a scan timing control signal to control an operation timing of the scan driving circuit and a data timing control signal to control an operation timing of the source drive ICs 120 and the polarity of a data voltage.

A scan timing control signal includes a gate start pulse VST, a gate shift clock CLK, a gate output enable signal GOE, and the like. The gate start pulse VST is input to the gate shift register 130 and controls a shift start timing.

The gate shift clock CLK is level-shifted by the level shifter 150 and then input to the gate shift register 130 and used as a clock signal for shifting the gate start pulse VST. The gate output enable signal GOE controls an output timing of the gate shift register 130.

The data timing control signal includes a source start pulse SSP, a source sampling clock SSC, a polarity control signal POL, and a source output enable signal SOE, and the like. The source start pulse SSP controls a shift start timing of the source drive ICs 120. The source sampling clock SSC is a clock signal that controls a sampling timing of data within the source drive ICs 120 based on a rising or falling edge thereof.

Figure 3:
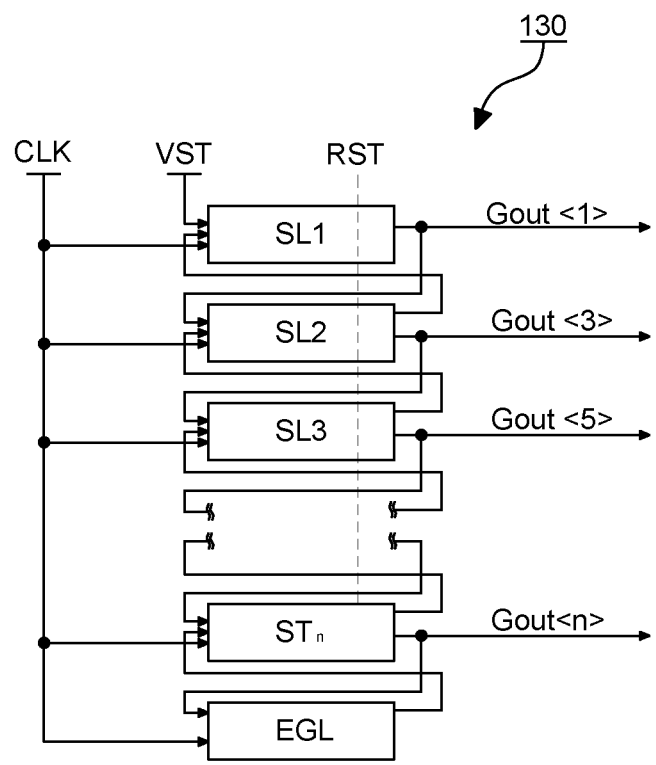
FIG. 3 is a block diagram illustrating a relationship between a plurality of stages of a GIP driving circuit and a control signal of the GIP driving circuit according to an exemplary embodiment of the present disclosure.

FIG. 3 is a block diagram illustrating a relationship between a plurality of stages of a GIP driving circuit and a control signal of the GIP driving circuit according to an exemplary embodiment of the present disclosure.

The GIP driving circuit may be formed on one edge or both edges of the display panel 160 outside a pixel array. The GIP driving circuit and the pixel array may be formed on the substrate of the display panel 160 at the same time. The GIP driving circuit includes a plurality of stages ST1 to STn to which the gate start pulse VST and the gate shift clock CLK are input.

The stages ST1 to STn generate outputs in response to the start pulse VST and shift the outputs according to the shift clock.

Each of the stages ST1 to STn of the gate shift register includes a Q node (not illustrated) for charging a gate pulse, a Q Bar node (not illustrated) for discharging the gate pulse, and a switch circuit (not illustrated) connected to the Q node and the Q Bar node. The switch circuit charges the Q node in response to a start pulse or an output of a previous stage to increase a voltage of the gate pulse. Then, the switch circuit discharges the Q Bar node in response to an output of a subsequent stage or a reset signal. The switch circuit includes TFTs configured as a metal oxide semiconductor field effect transistor (MOSFET).

Referring to FIG. 3, the gate shift register according to the present disclosure includes a plurality of stages ST1 to STn (n is a natural number equal to or greater than 2) connected in a cascade manner. The stages ST1 to STn output first to nth gate pulses Gout<1> to Gout<n>, respectively. While the gate pulses are applied to the gate lines GL of the display device, the gate pulses Gout1 to Goutn also serve as first carry signals Gout_pre and second carry signals Gout_post transferred to a previous stage and a subsequent stage. In the following, the term "previous stage" refers to a stage positioned above a reference stage.

For example, on the basis of a kth stage STk (k is a natural number satisfying 1<k<n), the previous stage refers to any one of a first stage ST1 to a k−1th stage ST (k−1).

Further, the term "subsequent stage" refers to a stage positioned under the reference stage. For example, on the basis of the kth stage STk (1<k<n), the subsequent stage refers to any one of a k+1th stage ST (k+1) to an nth stage.

Referring to FIG. 3, the gate shift register according to the present disclosure subsequently outputs gate pulses Gout(1) to Gout(n). In order to do so, a delayed gate shift clock CLK is subsequently input to the first stage ST1 to the nth stage STn.

The stages ST1 to STn of the gate shift register SR start outputting the gate pulses Gout1 to Goutn in response to the gate start pulse VST and shift the gate pulses Gout1 to Goutn in response to the gate shift clock CLK. The gate pulses Gout1 to Goutn respectively output from the stages ST1 to STn are supplied to gate lines (not illustrated) while being input to following stages as the first carry signals Gout_Pre. The first carry signals Gout_pre are used for pre-charging the Q node in order for the stages ST1 to STn to respectively generate outputs. However, the first carry signal Gout_Pre is not input to the first stage ST1, but the gate start pulse VST is input to the first stage ST1.

Further, after generating output signals, the stages ST1 to STn respectively receive the second carry signals Gout_Post for discharging the Q node. However, the second carry signal Gout_Post is not input to the nth stage STn which is the last stage.

Referring to FIG. 3, the gate shift register according to the present disclosure further includes dummy stages which do not generate outputs but supply the second carry signals Gout_Post to the other stages. For example, the nth stage (n is a positive integer equal to or greater than 2) outputting the last gate pulse is connected to an n+1th stage (or end generator). The n+1th stage does not output a gate pulse but supplies the second carry signal Gout_Post to the nth stage.

Figure 4:
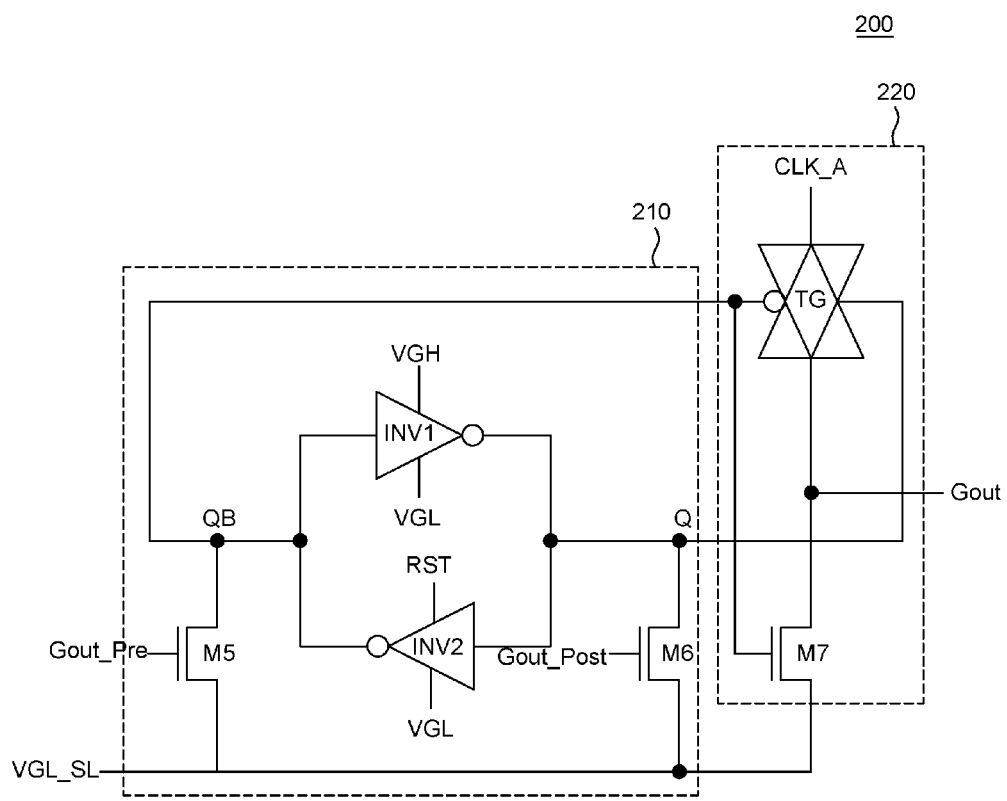
FIG. 4 is a circuit diagram specifically illustrating an nth stage STn illustrated in FIG. 3.
Figure 5:
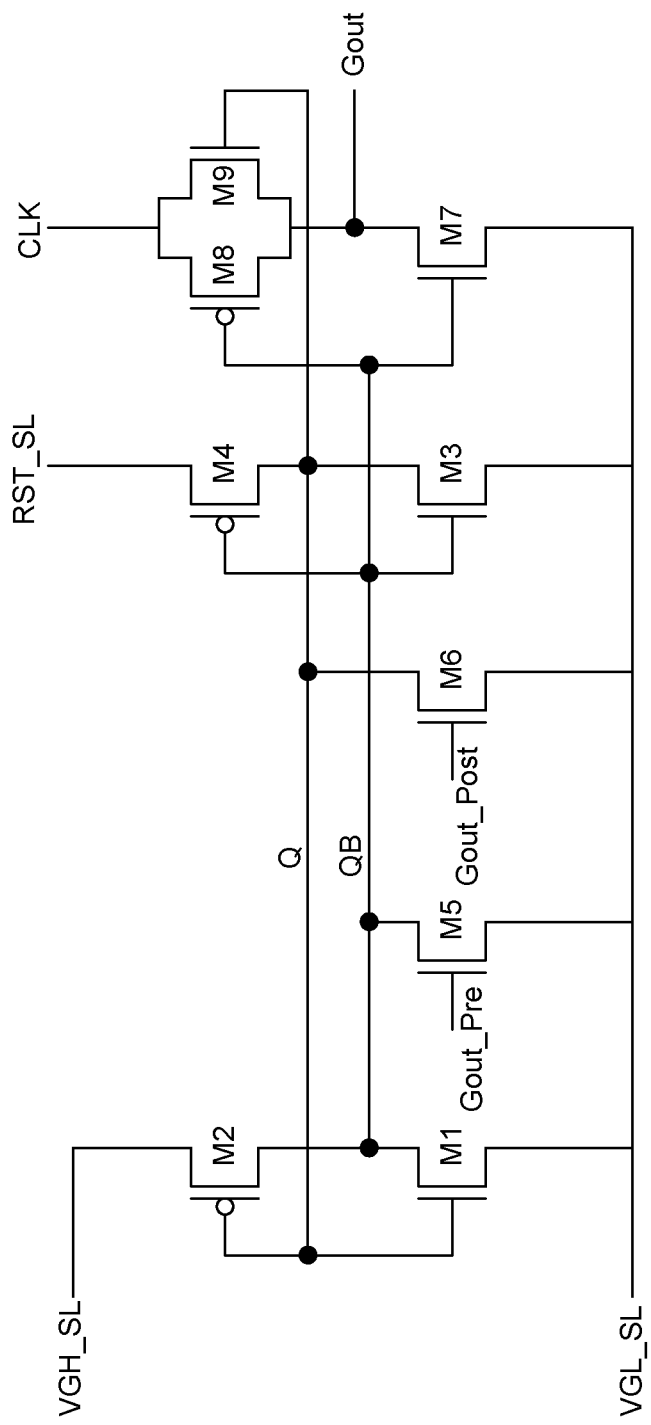
FIG. 5 is a circuit diagram illustrating the nth stage STn illustrated in FIG. 3 as a configuration of switch elements.

FIG. 4 is a circuit diagram specifically illustrating an nth stage STn illustrated in FIG. 3. FIG. 5 is a circuit diagram illustrating the nth stage STn illustrated in FIG. 3 as a configuration of switch elements.

A circuit illustrated in FIG. 4 is an nth stage circuit (n is a positive integer). In FIG. 4 and FIG. 5, M1, M3, M5, M6, M7, and M9 are implemented with an n-type MOSFET (hereinafter, referred to as "NMOS"), and M2, M4, and M8 are implemented with a p-type MOSFET (hereinafter, referred to as "PMOS").

Referring to FIG. 4 and FIG. 5, an nth stage (STn) 200 of the gate shift register according to the present disclosure includes a latch unit 210 and a buffer 220.

A reset signal RST, a shift clock CLK, a carry signal Gout_Pre or start pulse VST received from a previous stage, a gate high voltage VGH, and a gate low voltage VGL are input to each gate shift register. The first carry signal Gout_Pre input to an nth stage except a first stage is an output Gout of an n−1th stage. The first carry signal Gout-_Pre is not input to the first stage ST1, but the start pulse VST is input to the first stage ST1.

The nth stage (STn) 200 including the latch unit 210 according to an exemplary embodiment of the present disclosure is powered on, potentials of a Q node Q and a Q Bar node QB are randomly set to a high-potential voltage VGH or a low-potential voltage VGL. Therefore, it is necessary to reset the gate shift register to a state for an operation of the gate shift register. That is, when the gate shift register starts an operation, it is necessary to perform a reset for controlling a first signal.

A reset signal is supplied to a source of a second PMOS M4 through a reset signal supply line RST_SL. The reset signal is a signal which decreases from a high-potential voltage VGL to a low-potential voltage VGH and then increases to the high-potential voltage VGL. When the reset signal is input, the Q node Q is maintained at the low-potential voltage VGL and the Q Bar node QB is set to the high-potential voltage VGH.

The latch unit 210 includes two inverters INV1 and INV2 connected by a closed loop-shaped feedback circuit and adjusts a voltage of a Q Bar node QB in a state in which a voltage of a Q node Q is inverted.

In the latch unit 210, the two inverters are configured as CMOS transistors in a feedback manner. The Q Bar node QB of the latch unit 210 is connected to a drain terminal of a third NMOS M5 and controlled by the first carry signal Gout_Pre connected to a gate terminal of the third NMOS M5. Further, the Q node Q of the latch unit 210 is connected to a drain terminal of a fourth NMOS M6 and controlled by the second carry signal Gout_post connected to a gate terminal of the fourth NMOS M6.

A first inverter INV1 includes a first NMOS M1 and a first PMOS M2. A second inverter INV2 includes a second NMOS M3 and a second PMOS M4.

The first inverter INV1 supplies an inverted signal of the Q Bar node QB to the Q node Q. The first NMOS M1 includes a gate connected to the Q node Q, a drain connected to the Q Bar node QB, and a source connected to a VGL supply line VGL_SL. The first PMOS M2 includes a gate connected to the Q node Q, a drain connected to the Q Bar node QB, and a source connected to a VGH supply line VGH_SL.

The second inverter INV2 supplies an inverted signal of the Q node Q to the Q Bar node QB. The second NMOS M3 includes a gate connected to the Q Bar node QB, a drain connected to the Q node Q, and a source connected to a VGL line. The second PMOS M4 includes a gate connected to the Q Bar node QB, a drain connected to the Q node Q, and a source connected to the VGH supply line VGH_SL. Further, the source of the second PMOS M4 is connected to the RST supply line RST_SL through which the reset signal RST is supplied. That is, the latch unit 210 controls an operation of the buffer 220 using the high-potential voltage VGH or low-potential voltage VGL of the Q node Q and the Q Bar node QB. The buffer 220 includes a pull-up transistor that supplies a gate shift clock CLK to an output terminal in response to a voltage of the Q node Q, for the rising of an output voltage Gout. Further, the buffer 220 includes a pull-down transistor that discharges the output terminal in response to a voltage of the Q Bar node QB, for the falling of the output voltage Gout.

The pull-up transistor includes a transmission gate TG in which a sixth NMOS M9 and a third PMOS M8 are connected in parallel. The pull-down transistor includes a fifth NMOS M7. The output voltage Gout is a gate pulse supplied to a gate line.

The third PMOS M8 of the transmission gate TG includes a gate connected to the Q Bar node QB, a drain connected to the output terminal, and a source to which the gate shift clock CLK is input. Further, the sixth NMOS M9 of the transmission gate TG includes a gate connected to the Q node Q, a source connected to the output terminal, and a drain to which the gate shift clock CLK is input.

The fifth NMOS M7 includes a gate connected to the Q Bar node QB, a drain connected to the output terminal, and a source connected to the VGL supply line VGL_SL.

If a high-potential voltage VGH is applied to the Q node Q, the buffer 220 increases a gate pulse of the gate shift clock CLK to the output voltage Gout. Further, if the high-potential voltage VGH is applied to the Q Bar node QB, the buffer 220 decreases a low-potential voltage VGL transmitted from the VGL supply line VGL_SL to the output voltage Gout through the fifth NMOS M7. Therefore, in the latch unit 210, a voltage of the Q node Q and a voltage of the Q Bar node QB control a timing of an output voltage which is input to the buffer 220 and then supplied to a gate line.

Therefore, in the shift register according to the present disclosure, the latch unit 210 includes the two inverters configured in a feedback manner and the Q node Q and the Q Bar node QB are connected to the drains of the NMOS M5 and M6. Thus, the Q node Q and the Q Bar node QB are controlled by the first carry signal Gout_pre and the second carry signal Gout_post. Therefore, the output voltage Gout of the shift register is controlled by a gate pulse of the gate shift clock CLK.

As a result, the GIP driving circuit according to the present disclosure can minimize a switch element and a clock signal transmission line required for an operation of the shift register.

As described above, in the gate driving circuit according to the present disclosure, an automatic reset circuit is installed in each of the stages, and, thus, a separate reset signal line is not needed. Further, an off timing of the buffer can be controlled using a first clock, and, thus, an output voltage Vout can be discharged without a dummy stage (or end generator).

The exemplary embodiments of the present disclosure can also be described as follows:

According to an aspect of the present disclosure, there is provided a gate driving circuit. The gate driving circuit includes: a plurality of stages which sequentially receives a phase-delayed clock and sequentially generates an output. An nth stage (n is a positive integer) includes: a first switch T1 receiving a carry signal from an n−1th stage (n is a positive integer) and controlling a QB node to a low voltage and a Q node to a high voltage when the carry signal has a high voltage; a second switch T2 receiving a carry signal from an n+1th stage (n is a positive integer) and controlling the QB node to a high voltage and the Q node to a low voltage when the carry signal has a high voltage; a plurality of inverters connected between the Q node and the QB node and constituting a latch; and a buffer outputting a clock as an output voltage when a voltage of the Q node is a high voltage and output a low voltage as an output voltage when a voltage of the QB node is a high voltage.

The latch may include a first inverter and a second inverter connected by a closed loop-shaped feedback circuit.

The first inverter may include: a first NMOS transistor including a gate connected to the Q node, a drain connected to the QB node, and a source connected to a low voltage power line; and a first PMOS transistor including a gate connected to the Q node, a drain connected to the QB node, and a source connected to a high voltage power line.

The second inverter may include: a second NMOS transistor including a gate connected to the QB node, a drain connected to the Q node, and a source connected to a low voltage power line; and a second PMOS transistor including a gate connected to the QB node, a drain connected to the Q node, and a source connected to a high voltage power line.

The buffer may include: a pull-up transistor supplying the clock to an output terminal in response to the voltage of the Q node to increase the output voltage; and a pull-down transistor supplying the low voltage to the output terminal in response to the voltage of the QB node to decrease the output voltage.

The pull-up transistor may be a transmission gate.

The transmission gate may include: a third PMOS transistor including a gate connected to the QB node, a drain connected to the output terminal, and a source to which the clock is input; and a third NMOS transistor including a gate connected to the Q node, a source connected to the output terminal, and a drain to which the clock is input.

The pull-down transistor may be a fourth NMOS transistor including a gate connected to the QB node, a drain connected to the output terminal, and a source connected to the low voltage power line.

The first switch may be a fifth NMOS transistor including a gate connected to a carry signal transmission line from the n−1th stage (n is a positive integer), a drain connected to the QB node, and a source connected to the low voltage power line.

The second switch may be a sixth NMOS transistor including a gate connected to a carry signal transmission line from the n+1th stage (n is a positive integer), a drain connected to the Q node, and a source connected to the low voltage power line.

It will be apparent to a person having ordinary skill in the art that various changes and modifications can be made in the present disclosure without departing from the spirit or scope of the present disclosure. Therefore, the technical scope of the present disclosure should not be limited to the descriptions given above but should be determined by the following claims.

What is claimed is:

1. A Gate In Panel (GIP) driving circuit comprising:
a plurality of stages which sequentially receives a phase-delayed clock and sequentially generates an output,
wherein an nth stage (where n is a positive integer) includes:
a first switch receiving a carry signal from an n−1th stage (n is a positive integer) and controlling a QB node to a first voltage and a Q node to a second voltage when the carry signal has a second voltage;
a second switch receiving a carry signal from an n+1th stage (n is a positive integer) and controlling the QB node to a second voltage and the Q node to a first voltage when the carry signal has a second voltage;
a plurality of inverters connected between the Q node and the QB node and constituting a latch; and
a buffer outputting a clock as an output voltage when a voltage of the Q node is a second voltage and outputting a first voltage as an output voltage when a voltage of the QB node is a second voltage
wherein the second voltage is higher than the first voltage.

2. The GIP driving circuit according to claim 1, wherein the latch includes a first inverter and a second inverter connected by a closed loop-shaped feedback circuit.

3. The GIP driving circuit according to claim 2, wherein the first inverter includes:
a first NMOS transistor including a gate connected to the Q node, a drain connected to the QB node, and a source connected to the first voltage power line; and
a first PMOS transistor including a gate connected to the Q node, a drain connected to the QB node, and a source connected to the second voltage power line.

4. The GIP driving circuit according to claim 2, wherein the second inverter includes:
- a second NMOS transistor including a gate connected to the QB node, a drain connected to the Q node, and a source connected to the first voltage power line; and
- a second PMOS transistor including a gate connected to the QB node, a drain connected to the Q node, and a source connected to the second voltage power line.

5. The GIP driving circuit according to claim 1, wherein the buffer includes:
- a pull-up transistor supplying the clock to an output terminal in response to the voltage of the Q node to increase the output voltage; and
- a pull-down transistor supplying the first voltage to the output terminal in response to the voltage of the QB node to decrease the output voltage.

6. The GIP driving circuit according to claim 5, wherein the pull-up transistor is a transmission gate.

7. The GIP driving circuit according to claim 6, wherein the transmission gate includes:
- a third PMOS transistor including a gate connected to the QB node, a drain connected to the output terminal, and a source to which the clock is input; and
- a third NMOS transistor including a gate connected to the Q node, a source connected to the output terminal, and a drain to which the clock is input.

8. The GIP driving circuit according to claim 5, wherein the pull-down transistor is a fourth NMOS transistor including a gate connected to the QB node, a drain connected to the output terminal, and a source connected to the first voltage power line.

9. The GIP driving circuit according to claim 1, wherein the first switch is a fifth NMOS transistor including a gate connected to a carry signal transmission line from the n−1th stage (n is a positive integer), a drain connected to the QB node, and a source connected to the first voltage power line.

10. The GIP driving circuit according to claim 1, wherein the second switch is a sixth NMOS transistor including a gate connected to a carry signal transmission line from the n+1th stage (n is a positive integer), a drain connected to the Q node, and a source connected to the first voltage power line.

\* \* \* \* \*